United States Patent [19]
Rehm

[11] Patent Number: 5,939,912
[45] Date of Patent: Aug. 17, 1999

[54] RECOVERY CIRCUIT HAVING LONG HOLD TIME AND PHASE RANGE

[75] Inventor: Dennis J. Rehm, Fort Collins, Colo.

[73] Assignee: LSI Logic Corporation, Milpitas, Calif.

[21] Appl. No.: 08/878,160

[22] Filed: Jun. 18, 1997

[51] Int. Cl.⁶ .................................................. H03L 7/06
[52] U.S. Cl. .......................................... 327/158; 327/163
[58] Field of Search .................................... 327/141, 142, 327/147–150, 153, 155–159, 161, 165, 270, 276; 331/17; 375/373–376

[56] References Cited

U.S. PATENT DOCUMENTS

| | | | |
|---|---|---|---|
| 4,358,741 | 11/1982 | Nardin | 331/2 |
| 4,922,141 | 5/1990 | Lofgren et al. | 307/595 |
| 5,095,280 | 3/1992 | Wunner et al. | 328/63 |
| 5,172,397 | 12/1992 | Llewellyn | 375/110 |
| 5,192,886 | 3/1993 | Wetlaufer | 307/595 |
| 5,367,542 | 11/1994 | Guo | 375/110 |
| 5,399,995 | 3/1995 | Kardontchik et al. | 331/17 |
| 5,400,370 | 3/1995 | Guo | 375/118 |
| 5,420,531 | 5/1995 | Wetlaufer | 327/270 |
| 5,432,827 | 7/1995 | Mader | 375/576 |
| 5,451,894 | 9/1995 | Guo | 327/241 |
| 5,452,333 | 9/1995 | Guo et al. | 375/371 |
| 5,610,558 | 3/1997 | Mittel et al. | 331/2 |
| 5,675,273 | 10/1997 | Masleid | 327/156 |
| 5,703,905 | 12/1997 | Langberg | 375/232 |

Primary Examiner—My-Trang Nuton

[57] ABSTRACT

An recovery circuit is described for recovering data from serially transmitted digital signals wherein a very long hold time and infinite phase range is desired. The recovery circuit includes a variable delay line, a data tracking phase-locked loop (PLL), a clock tracking phase-locked loop, a phase sensor, and a switch. The variable delay line is responsive to a feedback signal and a clock signal for generating a first delayed phase-locked signal. The data tracking phase-locked loop is responsive to the first delayed phase-locked signal and a data signal for producing a data phase error signal. Similarly, the clock tracking phase-locked loop is responsive to the clock signal for providing a second delayed phase-locked signal. Responsive to both of the delayed phase-locked signals is the phase sensor which provides a select output signal when the phase-locked signals are in phase with each other. The switching circuit is connected to the data phase error signal for asserting data phase error signal, in response to the select output signal, as the feedback signal to the variable delay.

24 Claims, 3 Drawing Sheets

FIG. 4

RECOVERY CIRCUIT HAVING LONG HOLD TIME AND PHASE RANGE

FIELD OF THE INVENTION

The present invention relates to electronic circuits, and in particular to circuits using phase-locked loops with delay lines for recovering serially transmitted digital signals.

BACKGROUND OF THE INVENTION

The demand on electronic circuitry to accurately recover serially transmitted digital data has expanded as the speed of such transmissions has increased. High speed transmissions typically become distorted due to timing jitter and other sources of noise which, for all practical purposes, cannot be eliminated. Phase shifting of the serial transmission can also distort the data, especially when the incoming data and the receiving circuitry are not frequency locked to the same local clock. As expected, such distortions can result in data being lost or misread by the receiving circuitry.

In order to accurately track and decipher an incoming data transmission, many circuits currently use a digital phase-locked loop coupled with a delay circuit for reducing the effects of noise and phase shifting. The delay circuit, also referred to as a delay line, provides an output signal which lags by a precise amount with respect to the incoming data transmission for use in reading the data.

Delay lines have many applications. For example, delay lines are commonly used in disc drive systems and high speed dynamic RAM devices, which comprise the main memory of virtually all personal computers.

Delay lines normally consist of a plurality of series-connected cells, such as inverters, that are cascaded together. Each inverter provides a known amount of delay for delaying a digital signal consisting of data or control signals, to produce a delayed, or phase shifted copy of the original signal. The total amount of delay provided by the delay line is controlled by feedback from the phase-locked loop tracking the digital signal. Correspondingly, the output of the delay line provides a clock pulse with the appropriate phase to read the incoming data, enable signal synchronization, or other similar tasks.

Circuits which use delay lines typically require a fixed clock running at approximately the bit rate of the data to be recovered. However, even with the bit rate being known, problems arise when a frequency difference develops between the data frequency and the clock being used by the data recovery circuitry.

For instance, if the data frequency is slightly lower than the frequency used by the recovery circuitry, many of the prior art data recovery circuits will detect the phase drift and increase the amount of delay provided by the delay line such that the delay line output tracks (i.e., remains in phase with) the data frequency. This process of adjusting the phase used by the recovery circuitry will continue as both the data keeps arriving and the delay line is capable of increasing the amount of delay.

In theory, if the data transmission is infinitely long, then the delay line would need to be infinitely long to phase shift the recovery circuitry in the same direction as the incoming data. This would allow the recovery circuitry to track the incoming data for an infinite length of time. Further, it would give the recovery circuitry an infinite phase range. However, equipping recovery circuitry with a delay line of infinite length is not realistic.

U.S. Pat. No. 5,451,894, issued to Guo, provides a digital full range rotating phase shifter for use in controlled phase shifting, signal synchronization and data recovery. The phase shifter includes a rotating phase shift control and a phase shift range calibrator for increasing and decreasing the delay provided by a digitally adjustable delay. The disclosed device will "wrap around" the delay generated by the adjustable delay circuitry so that bidirectional 360 degree phase rotation is provided. The device requires, however, an array of complex control logic that can contribute to the generation of noise to surrounding circuitry.

The present invention overcomes the above discussed problems by providing an efficient circuit design with infinite linear phase adjustability and very long hold time for recovering serially transmitted digital signals.

SUMMARY OF THE INVENTION

The present invention provides a signal recovery circuit with a very long hold time and infinite phase range.

The structure embodying the present invention is especially suitable for applications such as the recovery of serially transmitted digital signals. The present invention allows for infinite phase adjustability during the recovery of serially transmitted signals. The present invention also provides for holding the delay of the delay line in the absence of any transition of the input data.

The recovery circuit embodying the present invention includes a variable delay line, a data tracking phase-locked loop (PLL), a clock tracking phase-locked loop, a phase sensor, and a switching circuit. The variable delay line is responsive to a feedback signal and a clock signal for generating a first delayed phase-locked signal. The data tracking phase-locked loop is responsive to the first delayed phase-locked signal and a data signal for producing a data phase error signal. Similarly, the clock tracking phase-locked loop is responsive to the clock signal for providing a second delayed phase-locked signal. Responsive to both of the delayed phase-locked signals is the phase sensor which provides a select output signal when the phase-locked signals are in phase with each other. The switching circuit is connected to the data phase error signal for asserting the data phase error signal, in response to the select output signal, as the feedback signal to the variable delay.

BRIEF DESCRIPTION OF THE DRAWINGS

In the accompanying drawings that form part of the specification, and in which like numerals are employed to designate like elements throughout the same.

DESCRIPTION OF THE PREFERRED EMBODIMENTS

Figure 1:
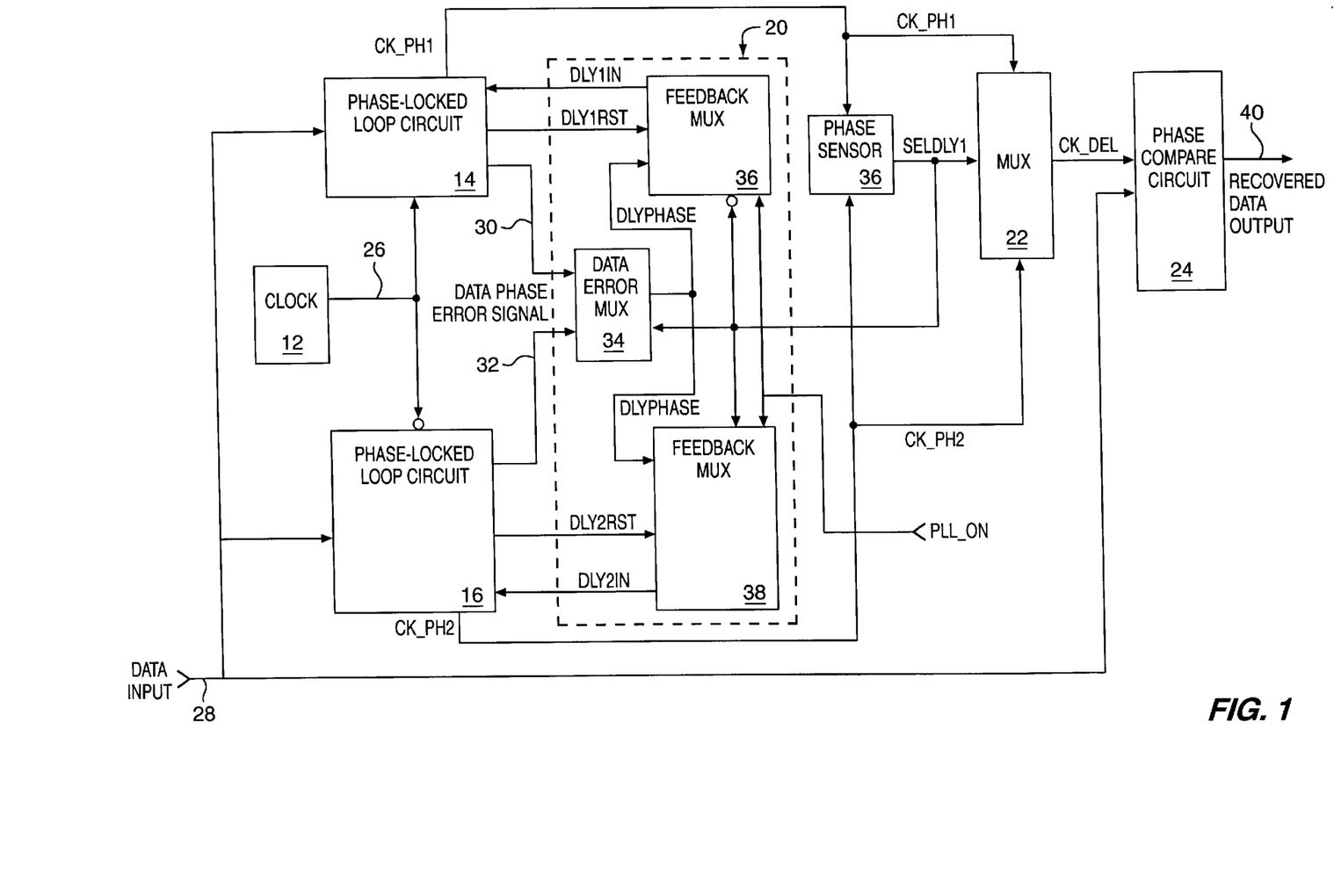
FIG. 1 is a block diagram illustrating a recovery circuit in accordance with the present invention having two digital phase-locked loop (PLL) circuits and a phase sensor for comparing the locked phase of each circuit.

The present invention provides a recovery circuit having a very long hold time and infinite phase range for recovering serially transmitted digital signals. Referring to the drawings, and particularly to FIG. 1, an embodiment of a recovery circuit in accordance with the present invention is depicted.

As shown, the recovery circuit 10 includes a clock 12, two digital phase-locked loop circuits 14,16, a phase sensor 18, a switching circuit 20, a multiplexer 22, and a phase compare circuit 24. The clock 12 provides a clock signal 26 which is received by the phase-locked loop circuits 14,16. The first phase-locked loop circuit 14 is responsive to the clock signal 26, a data input signal, and a feedback signal DLY1IN for producing a first phase-locked signal CK_PH1 and a data phase error signal. Likewise, the second phase-locked loop 16 is operatively connected to the clock signal 26 and a feedback signal DLY2IN for producing a second phase-locked signal CK_PH2 and a reset phase error signal DLY2RST. The phase sensor 18 is responsive to both the first phase-locked signal CK_PH1 and the second phase-locked signal CK_PH2 and provides a select signal SELDLY1 when the phase-locked signals are in phase with each other. The switching circuit 20 is responsive to the select signal SELDLY1 and asserts the data phase error signal as the feedback DLY1IN to the first phase-locked loop circuit 14 and the reset phase error signal DLY2RST as the feedback DLY2IN to the second phase-locked loop circuit 16.

Figure 2:
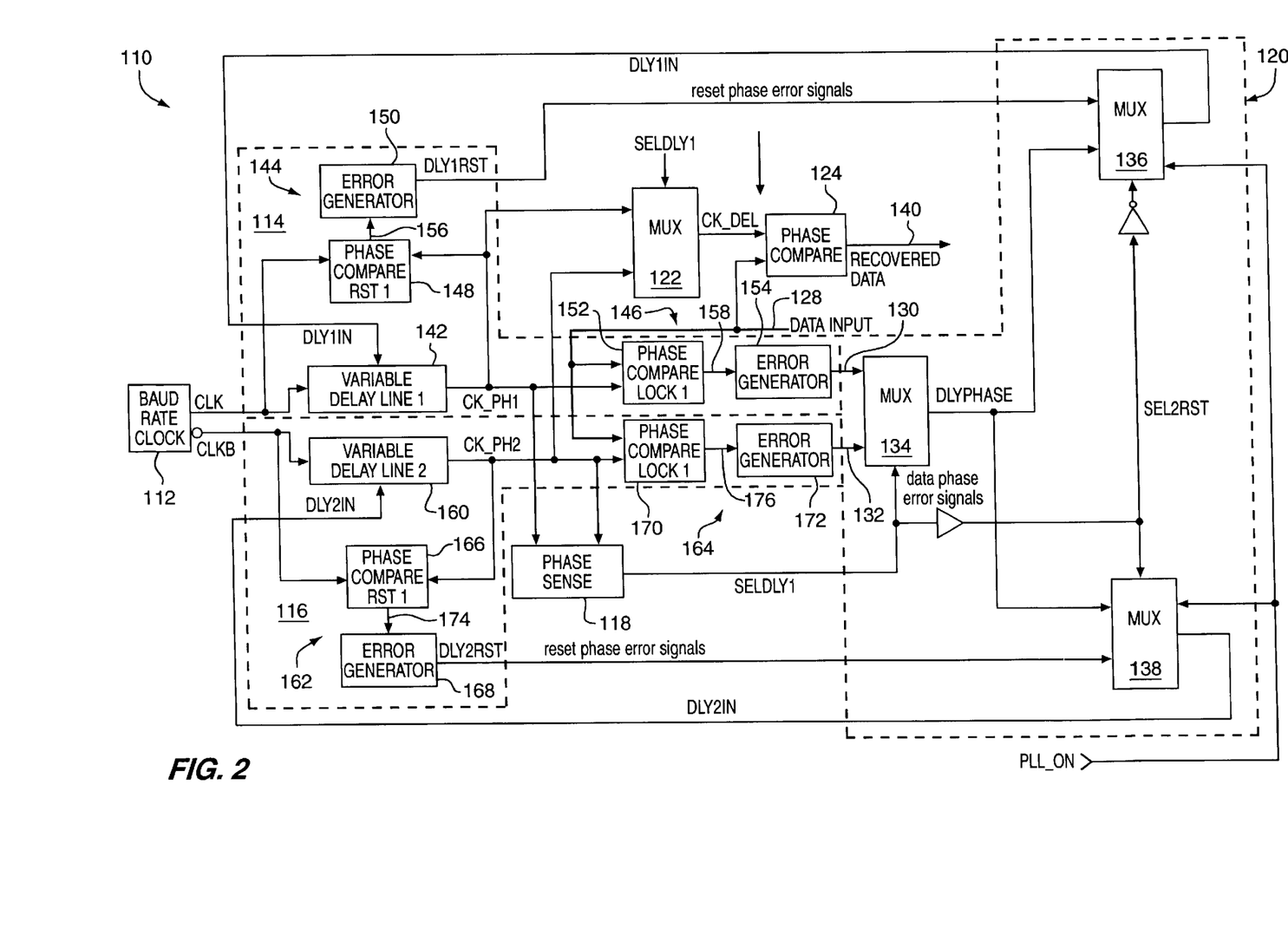
FIG. 2 is a further detailed block diagram depicting a recovery circuit similar to that shown in FIG. 1.
Figure 3:
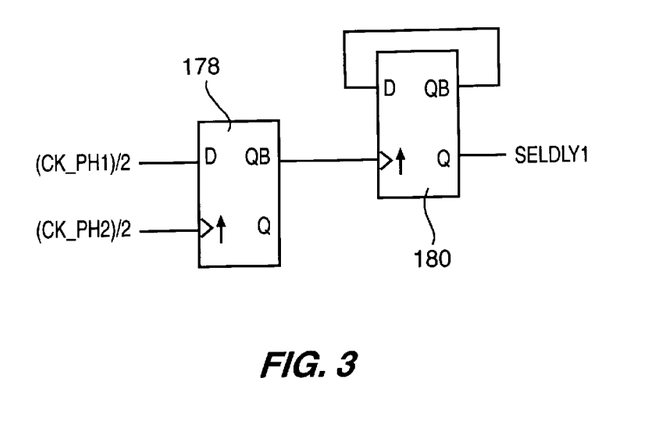
FIG. 3 is a simplified circuit schematic of a portion of the phase sensor shown in FIGS. 1 and 2.

Within FIGS. 1–3, a single block may indicate several individual components and/or circuits which collectively perform a single function. Likewise, a single line may represent several individual signal or energy transmission paths for performing a particular operation.

The clock 12 illustrated in FIG. 1 is of conventional construction for providing an output on lead 26 consisting of periodic digital signals. Preferably, the clock 12 provides approximately the same number of periods per second as the baud rate of the serial data transmission received at the data input 28 of the recovery circuit 10.

The output 26 of the clock 12 is connected to both of the phase-locked loop (PLL) circuits 14,16 which are substantially identical to each other except that phase-locked loop circuit 16 inverts the clock output. Both circuits 14 and 16 are responsive to the clock signal 26, data input 28, and feedback signals DLY1IN and DLY2IN, respectively, from switching circuit 20. As a response, phase-locked loop circuits 14 and 16 respectively provide delayed phase-locked signals CK_PH1 and CK_PH2, data phase error signals 30 and 32, and reset phase error signals DLY1RST and DLY2RST.

Each digital phase-locked loop circuit 14, 16 provides delay tracking of either the data input 28 or the clock output 26. Whether the data or clock is being tracked by phase-locked loop circuits 14 and 16 is determined by the feedback provided by signals DLY1IN and DLY2IN, respectively.

For instance, if data phase error signal 30 is carried by feedback signal DLY1IN, then phase-locked loop circuit 14 tracks the data input 28. Conversely, if reset phase error signal DLY1RST is carried by feedback signal DLY1IN, then phase-locked loop circuit 14 tracks the clock output 26.

Likewise, phase-locked loop circuit 16 tracks data input 28 if feedback signal DLY2IN consists of phase error signal 32. Further, phase-locked loop circuit 16 tracks inverted clock output 26 if feedback signal DLY2IN carries the reset phase error signal DLY2RST.

The delayed phase-locked output of the signals being tracked by phase-locked loop circuits 14 and 16 is provided by first and second phase-locked signals CK_PH1 and CK_PH2, respectively. Thus, depending on the signal being tracked by phase-locked loop circuit 14, CK_PH1 is approximately in phase with either the clock output 26 or the data input 28. Likewise, CK_PH2 is generally in phase with either the inverted clock output 26 or the data input 28.

Throughout this specification the phase-locked signals CK_PH1,CK_PH2 will often be referred to as being in phase with the clock 12 and data input 28. It is to be understood, however, that the phase-locked signals CK_PH1,CK_PH2 always lag behind the clock 12. Thus, the term "in phase" when used with respect to clock 12 refers to the phase-locked signals CK_PH1,CK_PH2 lagging behind by N times the clock period wherein N is a whole number greater than or equal to 1.

The clock output 26 can be any frequency with respect to the data input baud rate. In practice, however, having a clock period many times smaller than the baud rate will not yield optimum results. Further, it will be apparent to those having skill in the art, after perusal of this specification and the appended claims, that the delay line within each phase-locked loop circuit preferably is adjustable to provide a delay over a range of twice the larger of the clock high or low time.

The present invention also is not to be limited to those applications wherein the clock used (CLK and CLKB) is not a 50/50 duty cycle. However, due to implementation realities, it may be desirable that CLK and CLKB be kept to a duty cycle of better than 80/20.

When either phase-locked loop circuit 14,16 is tracking data input 28, the data phase error signal 30,32 provided by the circuit represents the error between the data input and the delayed phase-locked signal CK_PH1,CK_PH2 of the circuit. As such, data error signal 30 provides the phase error between data input 28 and delayed phase-locked signal CK_PH1 when loop circuit 14 is tracking the data input. Further, data error signal 32 depicts the phase error between data input 28 and delayed phase-locked signal CK_PH2 as loop circuit 16 tracks the data input.

Moreover, when either phase-locked loop circuit 14,16 is tracking clock 12, the reset phase error signal DLY1RST, DLY2RST generated by the phase-locked loop circuit provides the degree of error between the clock and the loop's phase-locked signal CK_PH1,CK_PH2. For example, reset phase error signal DLY1RST indicates the amount of error between clock signal 26 and phase-locked signal CK_PH1 when loop circuit 14 tracks the clock signal. Likewise, reset phase error signal DLY2RST reports the magnitude of the error between phase-locked signal CK_PH2 and inverted clock output 26.

As indicated above, the switching circuit 20 is connected to the data phase error signals 30 and 32 and the reset phase error signals DLY1RST and DLY2RST of phase-locked loop circuits 14 and 16, respectively. The switching circuit 20 provides feedback signals DLY1IN and DLY2IN to phase-locked loop circuits 14 and 16, respectively, in response to a feedback select signal SELDLY1.

As shown in FIG. 1, the switching circuit 20 includes one data error multiplexer 34 and two feedback multiplexers 36,38. The data error multiplexer 34 receives the phase error signals 30,32 from the loop circuits 14,16. The multiplexer 34 provides for selecting which of the error signals is to appear at the multiplexer output, DLYPHASE, in response to the feedback select signal SELDLY1.

The DLYPHASE output of multiplexer 34 is coupled to both of the feedback multiplexers 36,38. Further, feedback signals DLY1RST and DLY2RST from the phase-locked loop circuits 14,16 are connected, respectively, to multiplexers 36 and 38.

Multiplexers 36 and 38 are responsive to the feedback select signal SELDLY1 such that phase-locked loop circuits 14 and 16 either receive the DLYPHASE signal or their respective reset signal DLY1RST,DLY2RST as a feedback input signal DLY1IN,DLY2IN. Correspondingly, both the data error multiplexer 34 and the feedback multiplexers 36,38 are configured within the switching circuit 20 wherein, in response to the select signal SELDLY1, one phase-locked loop circuit receives its phase error signal as a feedback input while the other phase-locked loop circuit receives its reset signal as a feedback input. Thus, the select signal SELDLY1 has two states for exchanging the signal being tracked by each of the phase-locked loop circuits 14,16.

For instance, one state of the digital select signal SELDLY1 causes the switching circuit 20 to provide the data error output 30, via both the DLYPHASE and the DLY1IN signal leads, as feedback to phase-locked loop circuit 14. Further, reset signal DLY2RST is conveyed, via DLY2IN, as feedback to phase-locked loop circuit 16.

Conversely, in the other state, the digital select signal SELDLY1 causes the switching circuit 20 to provide reset signal DLY1RST, via DLY1IN, as feedback to phase-locked loop circuit 14. Also, both the DLYPHASE and the DLY2IN signal leads carry the data error output 32 as feedback to phase-locked loop circuit 16.

As apparent to those skilled in the art, the switching circuit 20 can consist of other numerous embodiments or combinations of multiplexers or like circuitry. For example, multiplexer 34 can be removed from the switching circuit 20 and data phase error signal 30 can be directly connected to multiplexer 36 and data phase error signal 32 can be directly connected to multiplexer 38. Correspondingly, the switching circuit 20 is not to be limited to a design consisting of three multiplexers.

As shown in FIG. 1, the select signal SELDLY1 is generated by phase sensor 18 which is responsive to the delayed phase-locked signals CK_PH1,CK_PH2 from the phase-locked loop circuits 14,16. The phase sensor 18 switches the state of the select signal SELDLY1 when the sensor detects that the phase-locked signals CK_PH1,CK_PH2 become substantially in phase with each other.

As stated above, the select signal SELDLY1 is received by the switching circuit 20 to change the signal being tracked by each of the phase-locked loop circuits 14,16. Further, the select signal SELDLY1, along with the delayed phase-locked signals CK_PH1 and CK_PH2, are coupled to multiplexer 22 which provides for designating which phase-locked signal is to appear at its output, CK_DEL, in response to the select signal.

The output CH_DEL of the multiplexer 22 and the data input 28 are coupled to phase compare circuit 24 for generating a recovered data output 40. The phase compare circuit 24 is of conventional design for comparing the delayed phase-locked loop signal with data input 28 to generate the recovered data output 40.

In operation, the recovery circuit 10 of FIG. 1 operates such that one of the loop circuits 14,16 provides a delayed phase-locked signal CK_PH1,CK_PH2 which tracks the serially transmitted data input 28 while the other loop circuit provides a delayed phase-locked signal which tracks the clock output 26 or its inverted complement. As stated above, whether each phase-locked loop circuit 14,16 tracks either the clock 12 or incoming data input 28 is determined by the feedback provided by the feedback signals DLY1IN, DLY2IN from switching circuit 20.

Although it is not critical which circuit 14,16 initially begins to track the data 28, in this embodiment loop 16 is initially assigned to track the data input 28 while loop 14 tracks the clock output 26. Preferably, an initialization signal PPL_ON is provided to configure multiplexers 36 and 38 when no data is being provided by the DATA INPUT.

When no data is detected, PPL_ON commands multiplexer 36 to assert the reset phase error signal DLY1RST as the feedback DLY1IN to the first phase-locked loop circuit 14. Further, PPL_ON commands multiplexer 38 to assert the reset phase error signal DLY2RST as the feedback DLY2IN to the second phase-locked loop circuit 16. Thus, the phase-locked loop circuits 14 and 16 track the clock output 26 and its complement which results in phase-locked signals CK_PH1 and CK_PH2 being approximately 180 degrees out of phase from each other as shown in FIG. 4.

When data is detected, the initialization signal PPL_ON is released wherein multiplexer 38 asserts the data phase error signal 32, being passed through multiplexer 34, as feedback DLY2IN to the second phase-locked loop circuit 16. Further, Multiplexer 36 continues to assert the reset phase error signal DLY1RST as the feedback DLY1IN to the first phase-locked loop circuit 14. Thus, the release of the PPL_ON signal results in loop circuit 16 tracking the data input 28 and loop circuit 14 tracking the clock output 26.

As loop circuit 16 is tracking the data input 28, multiplexer 22 is configured by the select signal SELDLY1 from phase sensor 18 to provide delayed phase-locked signal CK_PH2, via output CK_DEL, to the phase compare circuit 24. The data input 28 and the phase-locked signal carried by output CK_DEL are processed by the phase compare circuit 24 in a conventional manner known in the art to generate the recovered data output 40.

Figure 4:
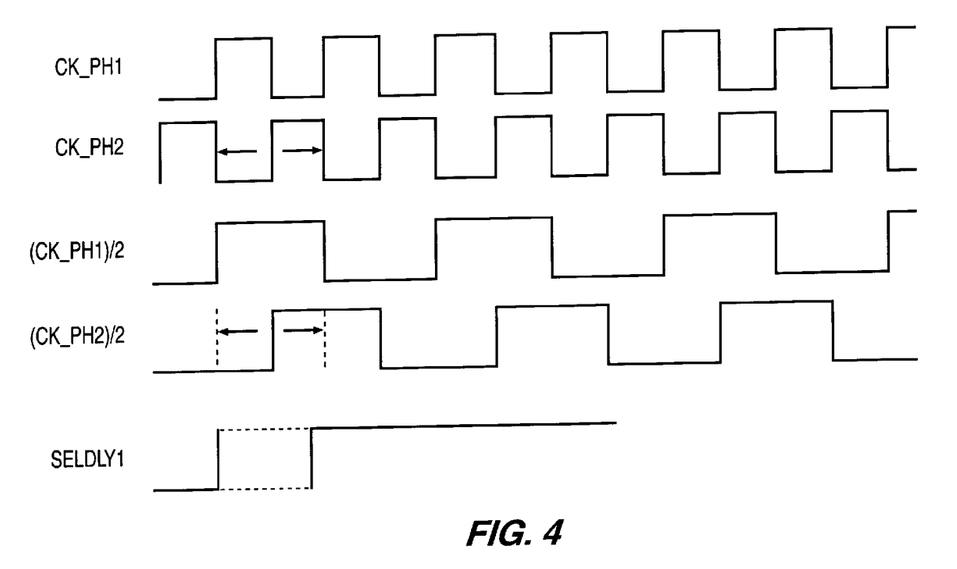
FIG. 4 is a timing and signal diagram of the phase sensor depicted in FIGS. 1 and 2.

As depicted by FIG. 4, the delayed phase-locked signal CK_PH2 will shift in either direction as the data signal 28 is being tracked by loop circuit 14. However, once signals CK_PH1 and CK_PH2 are substantially in phase with each other, the phase sensor 18 will command the multiplexer 22, via select signal SELDLY1, to switch the operation of the loop circuits 14,16 and the phase-locked signal being used in recovering data input 28.

The operation of the loop circuits 14,16 is switched such that loop 14 begins tracking the data input 28 as loop 16 tracks the complement of clock output 26. Correspondingly, CK_PH1 will provide a delayed phase-locked signal that tracks the data input 28 while CK_PH2 provides a signal that tracks the complement of clock output 26. Further, multiplexer 22 is switched such that phase-locked signal CK_PH1 is carried by the multiplexer output, CH_DEL, for providing a recovered data output 40 from data input 28.

CK_PH1 and CK_PH2 are approximately in phase with each other both immediately before and after the operation of the loop circuits 14,16 is switched. Since loop 16 is now tracking the inverted clock output 26, the amount of delay provided by loop 16 will adjust until CK_PH2 is in phase with the inverted clock output 26. Desirably, the time for CK_PH2 to become in phase with the complement of clock output 26 should be less than the time it takes for loop 14, which is tracking the data, to phase shift by 180 degrees. Likewise, when the operation of loops 14 and 16 is switched such that loop 16 tracks data and loop 14 tracks the clock output, it is desired that the time for CK_PH1 to come into phase with the clock output be less than the time required for CK_PH2 to be phase shifted by 180 degrees.

In the recovery circuit 10, only one of the loop circuits 14,16 will track the data input 28 until a phase change of 180 degrees has occurred. As one of the loop circuits 14,16 is tracking the data, the other loop circuit will servo back to its original state that produces an output signal CK_PH1,CK_PH2 that is delayed by N times the period of clock 12.

As will be appreciated by those skilled in the art, the recovery circuit described herein can be fabricated as an integrated circuit design. Further, in applications where the local clock source 12 does not have to be synthesized on chip but can be provided from an external crystal reference, an additional benefit will be the reduced jitter on the clock signal due to the potential high Q of external clock sources.

Turning to FIG. 2, another embodiment of a recovery circuit 110 in accordance with the present invention is provided. The recovery circuit 110 is similar to the device shown in FIG. 1 except for clock 112 having two clocked outputs CLK,CLKB which are inverted complements of each other. In FIG. 2, the last two digits in the 100-series of numerals depict structural elements that are similar in function to those described hereinabove and having numerals with the same last two digits.

The recovery circuit 110 includes the clock 112, two digital phase-locked loop circuits 114,116, phase sensor 118, switching circuit 120, multiplexer 122, and phase compare circuit 124. Preferably, clock 112 is a fixed frequency complementary clock source which provides output signal CLK to phase-locked loop 114 and output signal CLKB to phase-locked loop 116. Further, CLK and CLKB are approximately 180 degrees out of phase with each other wherein CLKB consists of an output signal that is a complement of clock signal CLK.

CLK and CLKB are connected to phase-locked loop circuit 114 and phase-locked loop circuit 116, respectively. The phase-locked loop circuits 114,116 are identical to each other. Phase-locked loop circuit 114 is responsive to the clock signal CLK, data input 128, and feedback signal DLY1IN. Likewise, phase-locked loop circuit 116 is responsive to the clock signal CLKB, data input 128, and feedback signal DLY2IN.

Moreover, loop circuits 114 and 116 provide delayed phase-locked signals CK_PH1 and CK_PH2, data phase error signals 130 and 132, and reset phase error signals DLY1RST and DLY2RST, respectively. Each phase-locked loop circuit 114,116 provides delay tracking of either the data input 128 or the clock 112. Whether the data or clock is being tracked by phase-locked loop circuits 114 and 116 is determined by the feedback provided by signals DLY1IN and DLY2IN, respectively.

Referring to loop circuit 114, the clock output CLK and feedback signal DLY1IN are connected within the circuit to a variable delay line 142 of conventional construction. The delay line 142 provides for delaying the clock output CLK, in response to feedback signal DLY1IN, to produce delayed phase-locked signal CK_PH1. Preferably, the delay line 142 provides for adjustably delaying or varying the clock output CLK such that signal CK_PH1 can be phase shifted, with respect to CLK, by at least 180 degrees in either direction.

The delay line 142 can be either continuous phase or discreet phase in design. As such, the delay line 142 may include, for example, a plurality of series-connected circuits such as inverters, or other types of delay lines such as LC and RC circuits.

The desired amount of delay provided by the delay line 142 is controlled by the feedback signal DLY1IN. Preferably, the delay line 142 is set to provide a nominal delay such that, when CLK and CK_PH1 are in phase with each other, signal CK_PH1 can be phase shifted by at least 180 degrees in either direction with respect to CLK.

The delayed phase-locked output CK_PH1 of variable delay line 142 is applied to a clock tracking phase-locked loop 144 and a data tracking phase-locked loop 146 within circuit 114. Both phase-locked loops 144 and 146 are conventional in construction. Loop 144 includes phase compare circuit 148 and error generator 150. Likewise, loop 146 includes phase compare circuit 152 and error generator 154.

Phase-locked loop 144 provides for tracking the clock output CLK to reset the variable delay line 142 such that CLK and CK_PH1 are in phase with each other and CK_PH1 can be phase shifted by approximately 180 degrees in either direction. Within phase-locked loop 144, the clock output signal, CLK, and the variable delay line output signal, CK_PH1, are connected to the phase compare circuit 148 for generating an output 156 representing the detected phase difference between the two signals. The output 156 of the phase compare circuit 148 is received by error generator 150 which varies the reset phase error signal DLY1RST in proportion to the detected phase difference.

Correspondingly, if the switching circuit 120 applies the reset phase error signal DLY1RST to feedback path DLY1IN, then phase locked loop 144 will track clock output CLK. The tracking of the clock output CLK by loop 144 will result in variable delay line 142 being set, or reset, to provide nominal delay of the clock output CLK as phase-locked output CK_PH1 is brought in phase with CLK.

As stated above, the phase-locked output signal CK_PH1 from variable delay line 142 is also connected to phase-locked loop 146 which provides for tracking of the data input 128. As such, the variable delay line output CK_PH1 and the data input 128 are connected to phase compare circuit 152 for generating an output 158 representing the phase difference between CK_PH1 and the data input. The phase compare circuit output 158 is received by error generator 154 which, in proportion to the phase difference, alters data phase error signal 130. Thus, if the switching circuit 120 applies the data phase error signal 130 to delay line 142, via feedback signal line DLY1IN, then phase locked loop 146 will track the data input 128 by adjusting the variable delay line accordingly.

As stated above, phase-locked loop circuit 116 has the same circuit design as 114. The principle difference between the two loop circuits is that clock output CLK is applied to loop 114 and clock output CLKB is applied to loop 116.

As shown in FIG. 2, the clock output CLKB and feedback signal DLY2IN are connected within circuit 116 to variable delay line 160 which provides for delaying the clock output CLKB, in response to feedback signal DLY2IN, to produce delayed phase-locked signal CK_PH2. Preferably, the delay line 160 is of the same construction as delay line 142 and allows for adjustably delaying or changing the delay of output signal CK_PH2 such that the signal can be phase shifted by at least 180 degrees in either direction with respect to CLKB.

The delay provided by delay line 160 is responsive to feedback signal DLY2IN with the delay line providing a nominal delay when CLKB and CK_PH2 are in phase with each other such that CK_PH2 can be, if required later, phase shifted by at least 180 degrees in either direction with respect to CLKB.

The phase-locked output CK_PH2 of variably delay 160 is applied to both clock tracking phase-locked loop 162 and data tracking phase-locked loop 164 within circuit 116. Loop 162 includes phase compare circuit 166 and error generator 168. Similarly, loop 164 includes phase compare circuit 170 and error generator 172.

Phase-locked loop 162 allows for tracking of the clock output CLKB to reset variable delay line 160 so that CLKB and CK_PH2 are in phase with each other and the delay line is capable of bi-directionally phase shifting CK_PH1 by approximately 180 degrees.

Connected to the phase compare circuit 166 are clock output CLKB and variable delay line output CK_PH2. The phase compare circuit 148 generates output 174 which represents the detected phase difference between clock output CLKB and delay line output CK_PH2. The phase compare output 174 is received by the error generator 168 which varies the reset phase error signal DLY2RST in relation to the phase difference. Thus, when reset phase error signal DLY2RST is carried by feedback signal line DLY2IN, phase locked loop 162 will track clock output CLKB. Such tracking will result in variable delay line 160 being set, or reset, to provide nominal delay as phase-locked output CK_PH2 is brought in phase with CLKB.

As previously stated, the variable delay line output CK_PH2 is also coupled to phase-locked loop 164 for tracking data input 128. Attached to the phase-locked loop compare circuit 170 of loop 164 are both the variable delay line output CK_PH2 and the data input 128. The phase compare circuit 170 provides output 176 for indicating the phase difference between CK_PH1 and the data input 128. The output signal 176 is received by error generator 172 which alters data phase error signal 132 in relation to the phase difference. Thus when data phase error signal 132 is applied to variable delay line 160, via feedback signal line DLY2IN, phase locked loop 164 will track the data input 146 by adjusting the variable delay line accordingly.

As indicated above, phase-locked signals CK_PH1 and CK_PH2 provide the delayed phase of the signals being tracked by phase-locked loop circuits 114 and 116, respectively. Therefore, CK_PH1 provides either the phase of the clock output CLK or the data input 128 depending on the signal being tracked by phase-locked loop circuit 114. Similarly, CK_PH2 provides either the phase of clock output CLKB or the data input 128.

As shown in FIG. 2, switching circuit 120 is attached to the data phase error signals 130,132 and the reset phase error signals DLY1RST,DLY2RST. The switching circuit 120 controls the feedback carried by signals DLY1IN and DLY2IN in response to select signal SELDLY1.

The switching circuit 120 preferably includes multiplexers 134, 136 and 138 which are configured such that, in response to select signal SELDLY1, only one phase-locked loop circuit 114,116 receives its reset signal as a feedback input with the other phase-locked loop receives its phase error signal as a feedback input. As such, those skilled in the art will realize that the switching circuit 120 can be designed to consist of other numerous embodiments or combinations of like circuitry.

Within FIG. 2, phase sensor 118 is responsive to the delayed phase-locked signals CK_PH1,CK_PH2 for generating select signal SELDLY1. The phase sensor 18 switches the state of select signal SELDLY1, and thus what is being tracked by circuits 114,116, when the phase-locked signals CK_PH1,CK_PH2 become substantially in phase.

The select signal SELDLY1 and delayed phase-locked signals CK_PH1,CK_PH2 are also coupled to multiplexer 122 which provides for designating the phase-locked signal, via CH_DEL, to be received by phase compare circuit 124. Finally, data input 128 and output signal are received by compare circuit 124 for generating a recovered data output 140.

In operation, the recovery circuit 110 depicted in FIG. 2 is similar to the circuitry of FIG. 1. As such, one of the loop circuits 114,116 of the recovery circuit 110 provides a delayed phase-locked signal CK_PH1,CK_PH2 which tracks the serially transmitted data input 128 while the other loop provides a delayed phase-locked signal which tracks the clock output CLK or CLKB.

The determination of whether a given phase-locked loop circuit 114,116 tracks the clock 112 or incoming data 128 is determined by the feedback provided by leads DLY1IN and DLY2IN. If, for example, circuit 116 is to initially track data input 128, then DLY2IN will provide feedback to variable delay line 160 from data tracking loop output 132. Further, circuit 114 will track clock output CLK wherein DLY1IN provides feedback to variable delay line 142 from clock tracking loop output DLY1RST.

Assuming that the serially transmitted data 128 is in phase with CLKB, the delayed phase-locked signals CK_PH1 and CK_PH2 provided by the delay lines 142 and 160 will be phase shifted approximately 180 degree from each other as shown in FIG. 4. In particular, CK_PH1 will provide a delayed phase-locked signal that tracks clock output CLK and CK_PH2 will provide a delayed phase-locke signal that tracks data input 128. Further, as data loop 164 is tracking input 128, multiplexer 122 is configured to provide phase-locked signal CK_PH2 to the phase compare circuit 124, via CH_DEL, for generating recovered data output 140.

As depicted by FIG. 4, the delayed phase-locked signals CK_PH1 and CK_PH2 are allowed to shift in either direction with respect to each other as the data 128 and clock signal CLK are being tracked by loops 164 and 144, respectively. However, once signals CK_PH1 and CK_PH2 have shifted such that they are in phase with each other, the phase sensor 118 will switch the logic level of the select signal SELDLY1. Changing the SELDLY1 signal will cause the switching circuit 120 and multiplexer 122 to reconfigure the operation of both loop circuits 114,116 and the signal used in recovering data 128.

The operation of the circuits 114,116 will be reconfigure such that data loop 146 will begin to track the data input 128 and clock loop 162 will track clock output CLKB. Correspondingly, CK_PH1 will provide a delayed phase-locked signal that tracks the data input 128 while CK_PH2 provides a signal that tracks the clock output CLKB. Further, multiplexer 22 is switched such that phase-locked signal CK_PH1 is carried by CK_DEL for generating the recovered data output 40 from data input 28.

CK_PH1 and CK_PH2 remain approximately in phase with each other both immediately before and after the operation of the tracking operations performed by circuits 114 and 116 are switched. Further, the variable delay line 160 will be reset to provide nominal delay of CLKB such that CLKB and CK_PH2 are brought back in phase with each other and CK_PH2 can later be phase shifted by at least 180 degrees in either direction with respect to CLKB when loop 164 resumes tracking of the data input 128.

After the switch in tracking operations to be performed by circuits 114 and 116, the delayed phase-locked signals CK_PH1 and CK_PH2 may continue to shift with respect to each other. If the locked signals CK_PH1 and CK_PH2 become 180 degrees out of phase with each other, the phase sensor 118 will again switch the operation of the loops 112,114 and the phase-locked signal used in recovering the data 128. Further, the variable delay line 142 will be reset, during tracking of CLK, such that signal CK_PH1 can be phase shifted by at least 180 degrees in either direction with respect to CLK when loop 146 resumes tracking the data input 128.

The switching of the operations performed by the loop circuits 114,116 in tracking the data input 128 will continue as the phase-locked signals CK_PH1 and CK_PH2 continue to shift from in phase to approximately 180 degrees out of phase with respect to each other. Further, the variable delay lines 142,160 will alternately be reset to provide a nominal delay so that each circuit 114,116 can track the data input 128 over a phase shift of approximately 180 degrees. thus, infinite phase adjustability is provided by the recovery circuit 110.

The outputs 130 and 132 of the error generators 154 and 172, respectively, may consist of one or more signal lines. The outputs 130 and 132 can be operably connected, via multiplexers 134, 136, and 138, to control the variable delay lines 142 and 160, respectively.

As will be appreciated by those skilled in the art, if the data being tracked has no transitions, then the output of the error generator used in tracking the data will not change and, correspondingly, the delay provided by delay line within the data tracking loop will be constant. Thus, the loop tracking the data will have the ability to hold phase for a very long time.

FIG. 3 provides a portion of the phase sensor circuitry for switching the logic state of SELDLY1 which consists of phase comparing flip-flop 178 and output flip-flop 180. Preferably, both flip-flops 178 and 180 are positive-edge triggered D type flip-flop. The circuitry depicted in FIG. 3 is for illustrative purposes only and additional logic circuitry as known in the art is used to implement phase sensor 118. Thus, after perusing this specification, one skilled in the art should easily be capable of constructing a phase sensor in accordance with the present invention.

The data input of phase comparing flip-flop 178 is coupled to (CK_PH1)/2 which is generally equivalent to CK_PH1 divided by 2 which results in a pulse frequency that is one-half of CK_PH1. Further, the clock input of comparing flip-flop 178 is coupled to (CK_PH2)/2 which is generally equivalent to CK_PH2 divided by 2 which results in a frequency that is one-half of CK_PH2 and initially 90 degrees out of phase with (CK_PH1)/2. Preferably, both (CK_PH1)/2 and (CK_PH2)/2 are generated by circuitry internal to phase sensor 118.

The inverted output of comparing flip-flop 178 is received by the clock input of flip-flop 180. Further, the inverted output of flip-flop 180 is coupled back into the D input of the flip-flop 180.

In operation, comparing flip-flop 178 toggles the clock input of the output flip-flop 180 whenever the logic state of (CK_PH1)/2 has transitioned and the positive edge of (CK_PH2)/2 is detected. Toggling the clock input of the output flip-flop 180 will result in the logic state of SELDLY1 being switched. Thus, the logic state of SELDLY1 will be changed whenever CK_PH1 and CK_PH2 are substantially in phase and 180 degrees out of phase with each other.

Although the embodiments described above switch the tracking operation of the phase-locked loop circuits as they become in phase with each other, it is to be understood that the present invention entails other embodiments wherein the tracking operation is switched at other than zero (0) degrees such as 360 degrees, 180 degrees, 90 degrees, 45 degrees, or other phase differences.

Moreover, an actual implementation of the above described recovery circuit could use only one clock tracking phased-locked loop which would be multiplexed between the clock outputs, as required, for resetting one of the variable delay lines. Further, only one data tracking phased-locked loop could be used which would be multiplexed between the delayed phase-locked signals CK_PH1,CK_PH2 to track the data input.

Correspondingly, it will be readily apparent from the foregoing detailed description of the invention and from the illustrations thereof that numerous variations and modifications may be effected without departing from the true spirit and scope of the novel concepts or principles of this invention.

I claim:

1. A recovery circuit for recovering data from a serially transmitted data signal comprising:
   (a) a clock for providing a clock signal;
   (b) a variable delay line responsive to a feedback signal and said clock signal for generating a first delayed phase-locked signal;
   (c) a data tracing phase-locked loop responsive to said delayed first phase-locked signal and said serially transmitted data signal for producing a data phase error signal;
   (d) a clock tracking phase-locked loop responsive to said clock signal for producing a phase error signal;
   (e) a phase sensor responsive to said first and a second delayed phase-locked signal for providing a select output signal when said first and second delayed phase-locked signals are in phase with each other; and
   (f) a switching circuit connected to said data phase error signal, said switching circuit responsive to said select output signal for asserting said data phase error signal as said feedback signal.

2. The recovery circuit of claim 1, wherein said data tracking phase-locked loop includes a phase compare circuit and an error generator operatively connected together for producing said data phase error signal.

3. The recovery circuit of claim 1, wherein said clock tracking phase-locked loop includes a phase compare circuit and an error generator operatively connected together for producing said phase error signal.

4. The recovery circuit of claim 1, further including another variable delay line coupled to said clock and responsive to a second feedback signal.

5. The recovery circuit of claim 4, wherein said other variable delay line is reset by said second feedback signal to provide a nominal delay of said second delayed phase-locked signal.

6. The recovery circuit of claim 4, wherein said clock tracking phase-locked loop further provides a reset phase error signal connected to said switching circuit, said switching circuit responsive to said select output signal for asserting said reset phase error signal as said second feedback signal.

7. The recovery circuit of claim 6, wherein said reset phase error signal resets said other variable delay line coupled to said clock tracking phase-locked loop to provide a nominal delay of said second delayed phase-locked signal.

8. The recovery circuit of claim 1, further including a phase compare circuit responsive to said serially transmitted data signal and said delayed phase-locked signal to generate a recovered data output.

9. A recovery circuit for recovering data from a serially transmitted data signal comprising:
   (a) a clock for providing a clock signal;
   (b) a first phase-locked loop circuit responsive to said clock signal, said data signal, and a feedback signal for producing a first phase-locked signal and a data phase error signal;
   (c) a second phase-locked loop circuit operatively connected to said clock signal, said data signal and another feedback signal for producing a second phase-locked signal and a reset phase error signal;

(d) a phase sensor responsive to said first phase-locked signal and said second phase-locked signal for providing a select signal when said first and second phase-locked signals are in phase with each other; and (e) a switching circuit responsive to said select signal for asserting said data phase error signal as said feedback to said first phase-locked loop circuit and asserting said reset phase error signal as said feedback to said second phase-locked loop circuit.

10. The recovery circuit of claim 9, wherein said first phase-locked loop circuit includes a data tracking phase-locked loop coupled to said data signal.

11. The recovery circuit of claim 10, wherein said first phase-locked loop circuit further includes a clock tracking phase-locked loop coupled to said clock signal.

12. The recovery circuit of claim 10, further including a variable delay line operatively connected to said data tracking phase-locked loop.

13. The recovery circuit of claim 9, wherein said second phase-locked loop circuit includes a clock tracking phase-locked loop coupled to said clock signal.

14. The recovery circuit of claim 13, wherein said second phase-locked loop circuit further includes a data tracking phase-locked loop coupled to said data signal.

15. The recovery circuit of claim 13, further including a variable delay line operatively connected to said clock tracking phase-locked loop.

16. The recovery circuit of claim 15, wherein said variable delay line is reset by said clock tracking phase-locked loop to provide a nominal delay of said second delayed phase-locked signal.

17. An apparatus for recovering data from a serially transmitted data signal comprising:

(a) a clock for providing a clock signal;

(b) a first phase-locked loop circuit operatively connected to said clock signal, said data signal, and a feedback signal for producing a first phase-locked signal;

(c) a second phase-locked loop circuit responsive to said clock signal, said data signal and another feedback signal for producing a second phase-locked signal; and (d) a phase sensor responsive to said first phase-locked signal and said second phase-locked signal for selecting either said first phase-locked signal or said second phase-locked signal to when said first and second phase-locked signals are in phase with each other compare with said data signal.

18. The apparatus of claim 17, wherein said first phase-locked loop circuit includes a data tracking phase-locked loop coupled to said data signal.

19. The apparatus of claim 18, further including a clock tracking phase-locked loop coupled to said clock signal.

20. The apparatus of claim 18, further including a variable delay line operatively connected to said data tracking phase-locked loop.

21. The apparatus of claim 17, wherein said second phase-locked loop circuit includes a clock tracking phase-locked loop responsive to said clock signal.

22. The apparatus of claim 21, further including a data tracking phase-locked loop coupled to said data signal.

23. The apparatus of claim 21, further including a variable delay line operatively connected to said clock tracking phase-locked loop.

24. The apparatus of claim 23, wherein said variable delay line is reset by said clock tracking phase-locked loop to provide a nominal delay of said second delayed phase-locked signal.

* * * * *